(12) United States Patent
Pagette et al.

(10) Patent No.: US 7,679,164 B2
(45) Date of Patent: Mar. 16, 2010

(54) BIPOLAR TRANSISTOR WITH SILICIDED SUB-COLLECTOR

(75) Inventors: Francois Pagette, Wappingers Falls, NY (US); Christian Lavoie, Ossining, NY (US); Anna Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 11/620,242

(22) Filed: Jan. 5, 2007

(65) Prior Publication Data

US 2008/0164494 A1    Jul. 10, 2008

(51) Int. Cl.
*H01L 27/102* (2006.01)
(52) U.S. Cl. .................. 257/576; 257/526; 257/552; 257/E29.034; 257/E29.114
(58) Field of Classification Search .............. 257/197, 257/508, 517, 526, 552, 565, 576, E29.033, 257/E29.034, E29.114
See application file for complete search history.

(56) References Cited

U.S. PATENT DOCUMENTS

| | | | | |
|---|---|---|---|---|
| H000763 H | * | 4/1990 | Feygenson | ............... 257/518 |
| 5,177,582 A | * | 1/1993 | Meister et al. | ............ 257/588 |
| 5,256,896 A | * | 10/1993 | Ning | ........................ 257/585 |
| 5,319,239 A | * | 6/1994 | Ning | ........................ 257/585 |
| 5,541,120 A | * | 7/1996 | Robinson et al. | ........... 438/202 |
| 5,841,197 A | | 11/1998 | Adamic, Jr. | |
| 6,326,292 B1 | | 12/2001 | Soderbarg et al. | |
| 6,333,235 B1 | | 12/2001 | Lee et al. | |
| 6,706,583 B1 | * | 3/2004 | Comard | .................... 438/235 |
| 6,838,348 B2 | | 1/2005 | Babcock et al. | |
| 6,846,710 B2 | * | 1/2005 | Yi et al. | .................... 438/202 |
| 7,022,578 B2 | | 4/2006 | Verma et al. | |
| 2003/0193077 A1 | | 10/2003 | Fujii | |

FOREIGN PATENT DOCUMENTS

WO    2004090988    10/2004
WO    2004090989    10/2004

OTHER PUBLICATIONS

International Search Report and Written Opinion for FIS920060214PCT.

* cited by examiner

*Primary Examiner*—Matthew E Warren
(74) *Attorney, Agent, or Firm*—Yuanmin Cai (57) ABSTRACT

Embodiments of the invention provide a semiconductor device including a collector in an active region; a first and a second sub-collector, the first sub-collector being a heavily doped semiconductor material adjacent to the collector and the second sub-collector being a silicided sub-collector next to the first sub-collector; and a silicided reach-through in contact with the second sub-collector, wherein the first and second sub-collectors and the silicided reach-through provide a continuous conductive pathway for electrical charges collected by the collector from the active region. Embodiments of the invention also provide methods of fabricating the same.

25 Claims, 12 Drawing Sheets

BIPOLAR TRANSISTOR WITH SILICIDED SUB-COLLECTOR

FIELD OF THE INVENTION

The present invention relates generally to bipolar transistors. More specifically, it relates to a heterojunction bipolar transistor (HBT) with silicided sub-collector and fabrication thereof.

BACKGROUND OF THE INVENTION

A bipolar junction transistor usually includes two back-to-back p-n junctions that share a thin common region. In other words, a bipolar junction transistor typically includes three regions, two outer regions commonly known as "emitter" and "collector" respectively, and a middle region commonly known as "base". Electrical connections are generally made to all three regions.

A heterojunction bipolar transistor (HBT) is a bipolar junction transistor that employs at least two different kinds of semiconductor materials. By virtue of this difference in material, energy band-gaps, as well as other material related properties, may be made different for regions of emitter, base and collector of the HBT. In addition, a gradual change of semiconductor material, also known as grading, may also be possible inside one or more of the regions. The use of heterojunction provides an added degree of freedom in design, which often results in improved performance, when being compared with its homojunction counterpart, of the HBT device.

Improvement in transistor performance, especially its operation speed, is generally considered as essential for achieving improved performance of a network communication system wherein various types of transistors are normally used. Bipolar transistors with a silicon germanium ("SiGe") intrinsic base may be capable of delivering performance required for such communication system. So far, a SiGe-HBT has demonstrated cut-off frequency of up to 350 GHz ($f_T$). SiGe is a compound semiconductor with a band-gap narrower than pure silicon (Si). Similar to a conventional silicon ("Si") bipolar transistor except for the base, SiGe is normally used as a base material inside a SiGe-HBT.

On the other hand, collector resistance also heavily influences the maximum operating frequency ($f_{max}$). As other parameters of a HBT improve, parasitic resistance ($R_c$) of the collector of HBT is increasingly becoming a limiting factor for the device performance. High collector parasitic resistance $R_c$ may limit cut-off frequency $f_T$, the impact of which may be measured, as is well known in the art, as a function of base transit time and collector space-charge transit time. A lowered $f_T$ may ultimately limit the maximum operating frequency $f_{max}$ of the HBT device.

Collector parasitic resistance, $R_c$, may be considered coming mainly from three sources: a first resistance as the electrons flow vertically through the lightly doped semiconductor region from a collector-base junction down to a buried layer ("sub-collector"), a second resistance as the electrons flow laterally through the heavily doped semiconductor called the buried layer, and a third resistance as the electrons flow vertically from the buried layer through the heavily doped semiconductor region called the reach-through up the surface silicide region. The doped semiconductor regions are usually formed by ion implantation followed by thermal anneal, or by dopant diffusion, or in-situ doped deposition as known in the art.

As described above, there is a need in the art to reduce the overall collector parasitic resistance $R_c$ in order to improve the performance of a HBT device, in particular its operating speed. This may be accomplished by reducing resistances from one or more of the above three sources.

SUMMARY OF THE INVENTION

Embodiments of the present invention provide a semiconductor device, which may be for example a heterojunction bipolar transistor (HBT). The semiconductor device may include a collector in an active region; a first and a second sub-collector with the first sub-collector being a doped semiconductor adjacent to the collector and the second sub-collector being a silicided sub-collector next to the first sub-collector; and a silicided reach-through in contact with the second sub-collector. The first and second sub-collectors provide a horizontal conductive pathway whereas the silicided reach-through provides a vertical conductive pathway continued from the horizontal conductive pathway for electrical charges collected by the collector from the active region.

The semiconductor device may further include an emitter and an extrinsic base, which may be formed at least partially on top of the active region. In addition, the active region may further include an intrinsic base upon which the emitter and the portion of the extrinsic base are formed. The emitter and the extrinsic base are separated by at least one dielectric spacer.

The semiconductor device may also include a layer of dielectric material such as for example oxide on top of the emitter, the extrinsic base, and the silicided reach-through. One or more conductive studs may be formed inside and through the layer of oxide and being in contact with the emitter, the extrinsic base, and the silicided reach-through, respectively.

According to one embodiment, the silicided reach-through is separated from the active region which includes the collector and the intrinsic base, by a dielectric material, and the dielectric material is at least partially on top of the second sub-collector.

Embodiments of the present invention provide methods of fabricating the semiconductor device. Embodiments of one method may include defining a sub-collector region in a layer of doped semiconductor material; forming an active region, a reach-through region, and a dielectric region on top of the doped semiconductor material with the dielectric region separating the active region from the reach-through region; and siliciding the reach-through region and a portion of the sub-collector region to form a partially silicided conductive pathway. The partially silicided conductive pathway may provide a relatively low parasitic resistance for the device.

According to one embodiment, the method may further include forming an emitter and an extrinsic base at least partially on top of the active region. The method may also include depositing a dielectric layer and forming a plurality of conductive studs inside and through the dielectric layer to provide electrical connections to the emitter, the extrinsic base, and the reach-through underneath the dielectric layer.

BRIEF DESCRIPTION OF THE DRAWINGS

The present invention will be understood and appreciated more fully from the following detailed description of the invention, taken in conjunction with the accompanying drawings of which.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF THE INVENTION

Figure 1:
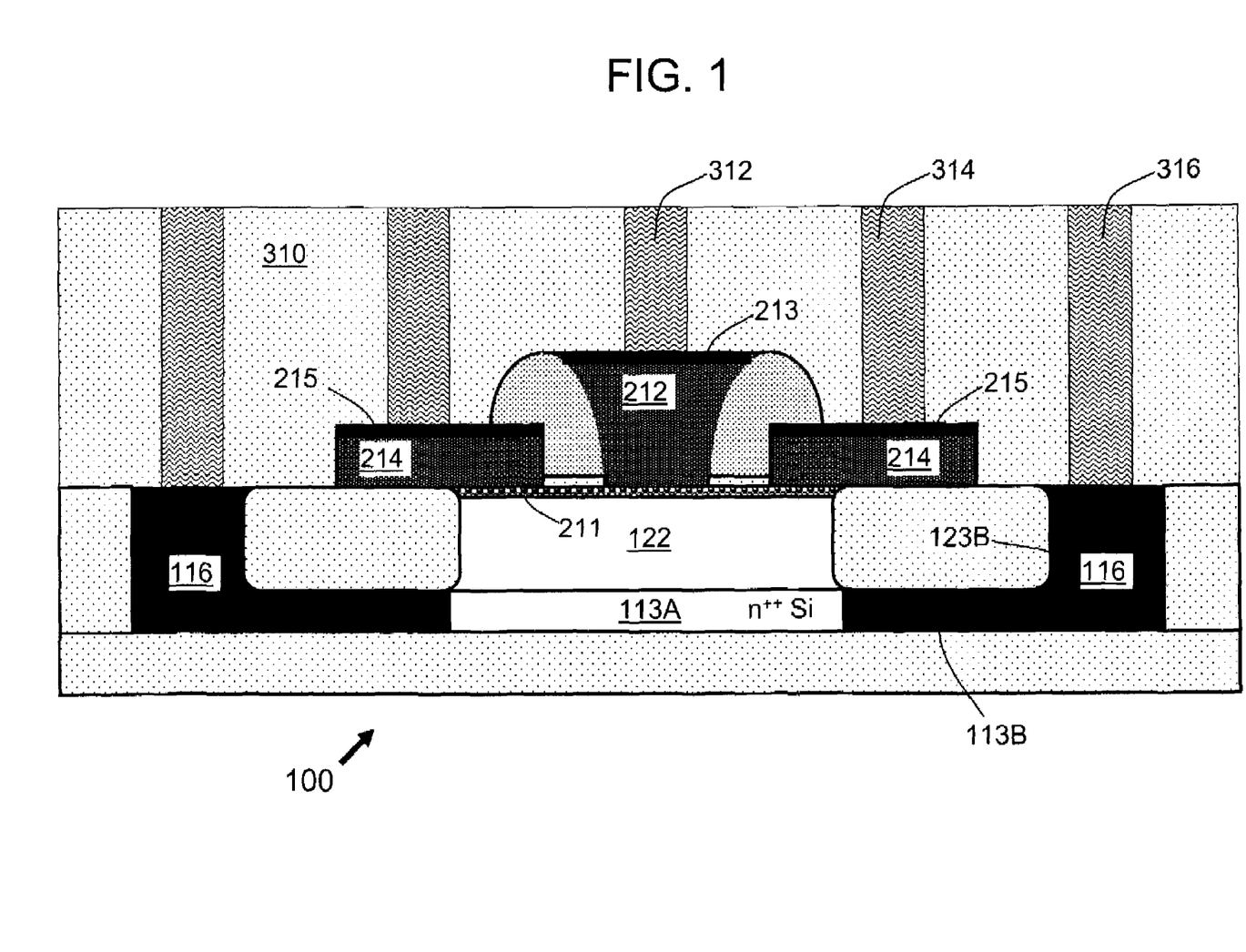
FIG. 1 is a demonstrative illustration of a cross-sectional view of a heterojunction bipolar transistor in accordance with one embodiment of the present invention.
Figure 3:
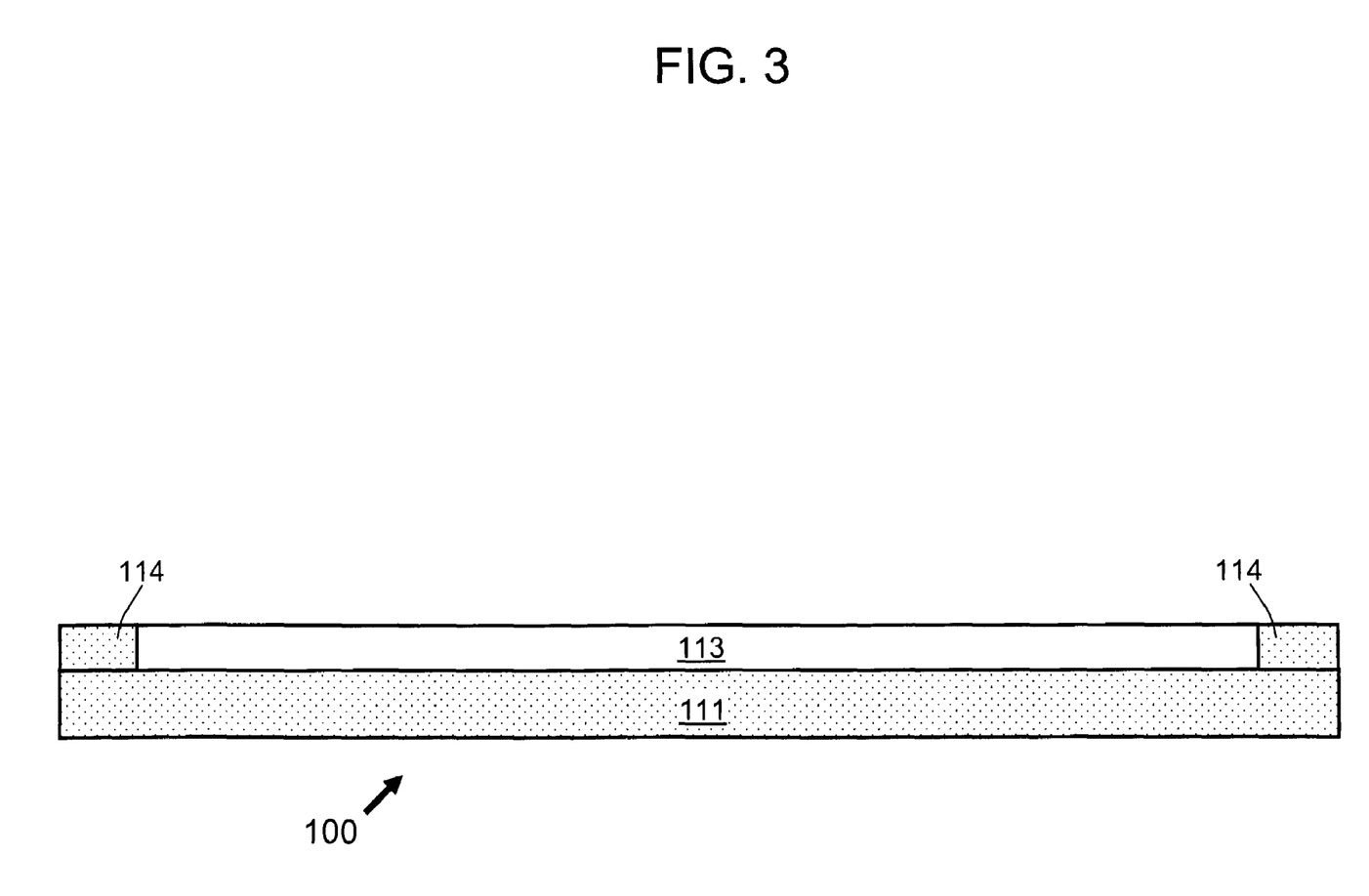

FIG. 1 is a demonstrative illustration of a cross-sectional view of a heterojunction bipolar transistor (HBT) in accordance with one embodiment of the present invention. HBT 100 may include an emitter 212, an extrinsic base 214, an intrinsic base 211, and a collector 122. As shown in FIG. 1, intrinsic base 211 and collector 122 may be part of an active region which may be contacted by a buried layer of sub-collector region 113 (FIG. 3). Sub-collector region 113 may include a first sub-collector 113A proximate to the center, of n-type heavily doped silicon (Si) semiconductor for example, and a second sub-collector 113B. The second sub-collector 113B may be a silicided sub-collector next to the first sub-collector 113A, and may be in contact with a silicided reach-through or reach-through region 123B. Sub-collector region 113 may provide a horizontal conductive pathway from beneath collector 122 to silicided reach-through 123B, which provides a vertical conductive pathway to a top surface of HBT 100.

FIG. 1 also illustrates that contact or electrical connection to HBT 100 may be made through one or more conductive studs 312, 314, and/or 316 formed inside and/or through a layer of dielectric material 310. For example, conductive stud 312 may be in contact with a silicided top surface or section 213 of emitter 212; conductive stud 314 may be in contact with a silicided top surface or section 215 of extrinsic base 214; and conductive stud 316 may be in contact with silicided reach-through 123B. Electrical connection to collector 122 may be made through conductive stud 316, silicided reach-through 123B, silicided sub-collector 113B, and sub-collector 113A. Together, silicided reach-through 123B and silicided sub-collector 113B may be collectively referred to as a silicided conductive path 116. A person skilled in the art will appreciate that a total resistance to collector 122 is substantially reduced by the reduction in resistance of silicided conductive path 116.

FIGS. 2-12 are demonstrative illustrations of steps of fabricating a HBT in accordance with embodiments of the present invention. A person skilled in the art will appreciate that FIGS. 2-12 are cross-sectional views of the structure of the HBT. Therefore, even though some element such as, for example, a collector of the HBT may be illustrated in FIGS. 2-12 as two (or more) separate members, they may in fact represent a single member of the collector of the HBT device. So is true for some other elements of the HBT such as, for example, an extrinsic base. As a person of ordinary skill will appreciate that the collector and the extrinsic base of a HBT may have a ring-type shape such as, for example, a circle, an oval, or a rectangular shape, when being viewed from the top of the device.

It shall also be noted that, although the following demonstrative illustrations may focus on the fabrication of a particular heterojunction bipolar transistor, a person skilled in the art will appreciate that embodiments of the present invention may also be applies to other types of semiconductor devices.

In the following sections, for the ease of description, structures of the semiconductor device illustrated in FIG. 2 through FIG. 12 may be referred to as HBT 100 in general, even though some of the drawings may only illustrate a part of HBT 100, or in other words, a work-in-progress (WIP) HBT 100. A completed HBT 100 is demonstratively illustrated in FIG. 1.

Figure 2:
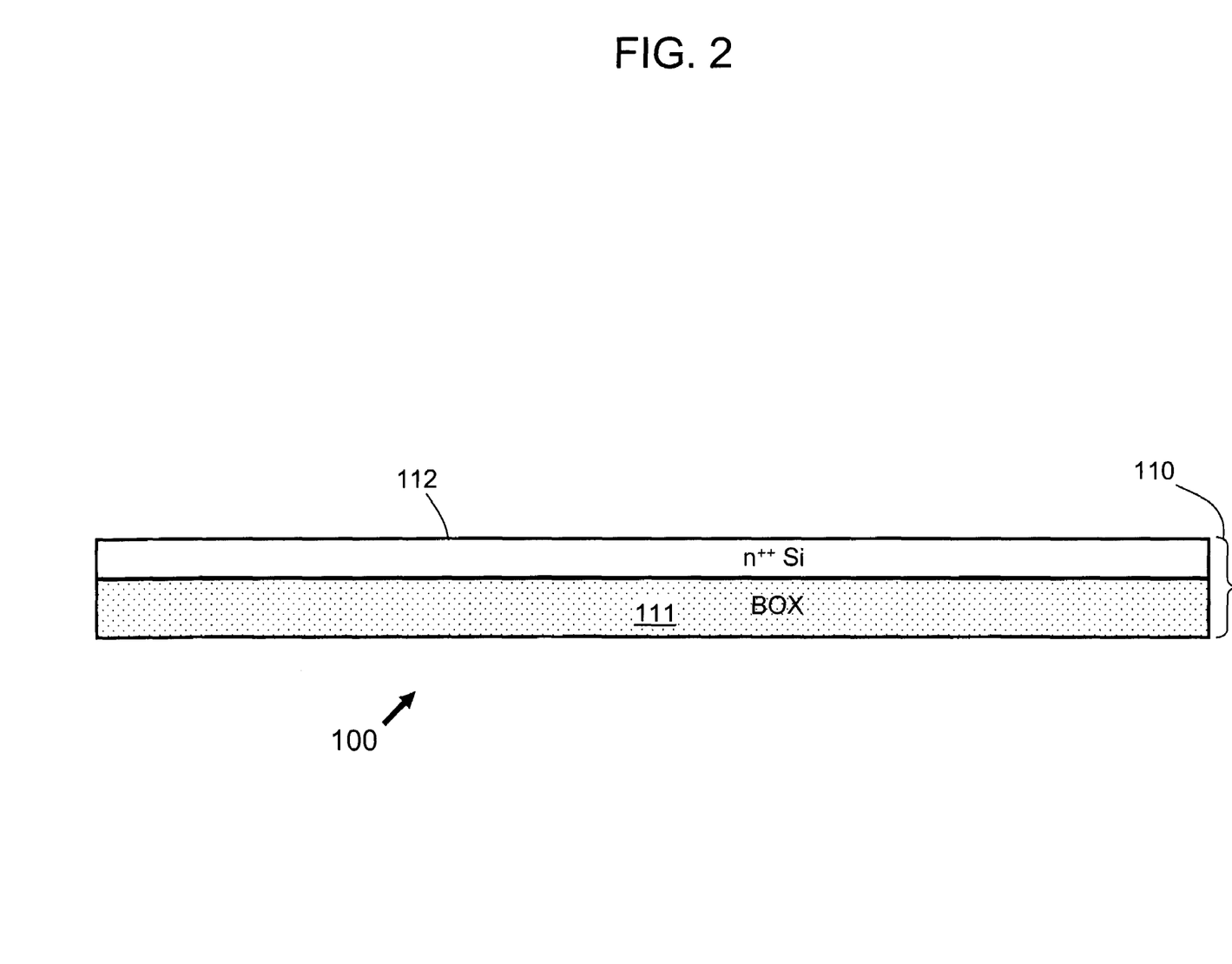
FIGS. 2-12 are demonstrative illustrations of steps of fabricating a heterojunction bipolar transistor in accordance with embodiments of the present invention.

According to one embodiment, a process and/or method of fabrication may start with a semiconductor wafer 110 as shown in FIG. 2. Semiconductor wafer 110 may be any type of wafers of suitable semiconductor material, and may be preferably a silicon-on-isolator (SOI) wafer. As shown in FIG. 2, SOI wafer 110 may have an n-type heavily doped silicon (Si) layer 112 on top of a buried oxide (BOX) layer 111. BOX layer 111 may in turn be on top of a p-type lightly doped ($\sim10^{15}$ cm$^{-3}$) silicon substrate (not shown), as is well-known in the art for a typical SOI wafer.

Embodiment of a method of fabrication may include defining a sub-collector region 113, as shown in FIG. 3, within silicon layer 112 of wafer 110. Defining sub-collector region 113 may include forming shallow trench insulation (STI) regions 114 surrounding sub-collector region 113. STI regions 114 may be formed or created by following any of well-known semiconductor processing techniques. For example, one technique may include first depositing a passivation layer, for example, a photo-resistant layer, and developing a photo-mask from the photo-resistant to cover sub-collector region 113, creating openings for the STI through for example a reactive-ion-etching (RIE) process, and depositing a dielectric material, such as oxide, into the openings to form or create STI regions 114. The deposition of dielectric material may be followed subsequently by for example a chemical-mechanical-polishing (CMP) process to planarize a top surface of STI regions 114 and removing the passivation layer to form the structure as shown in FIG. 3.

Figure 4:
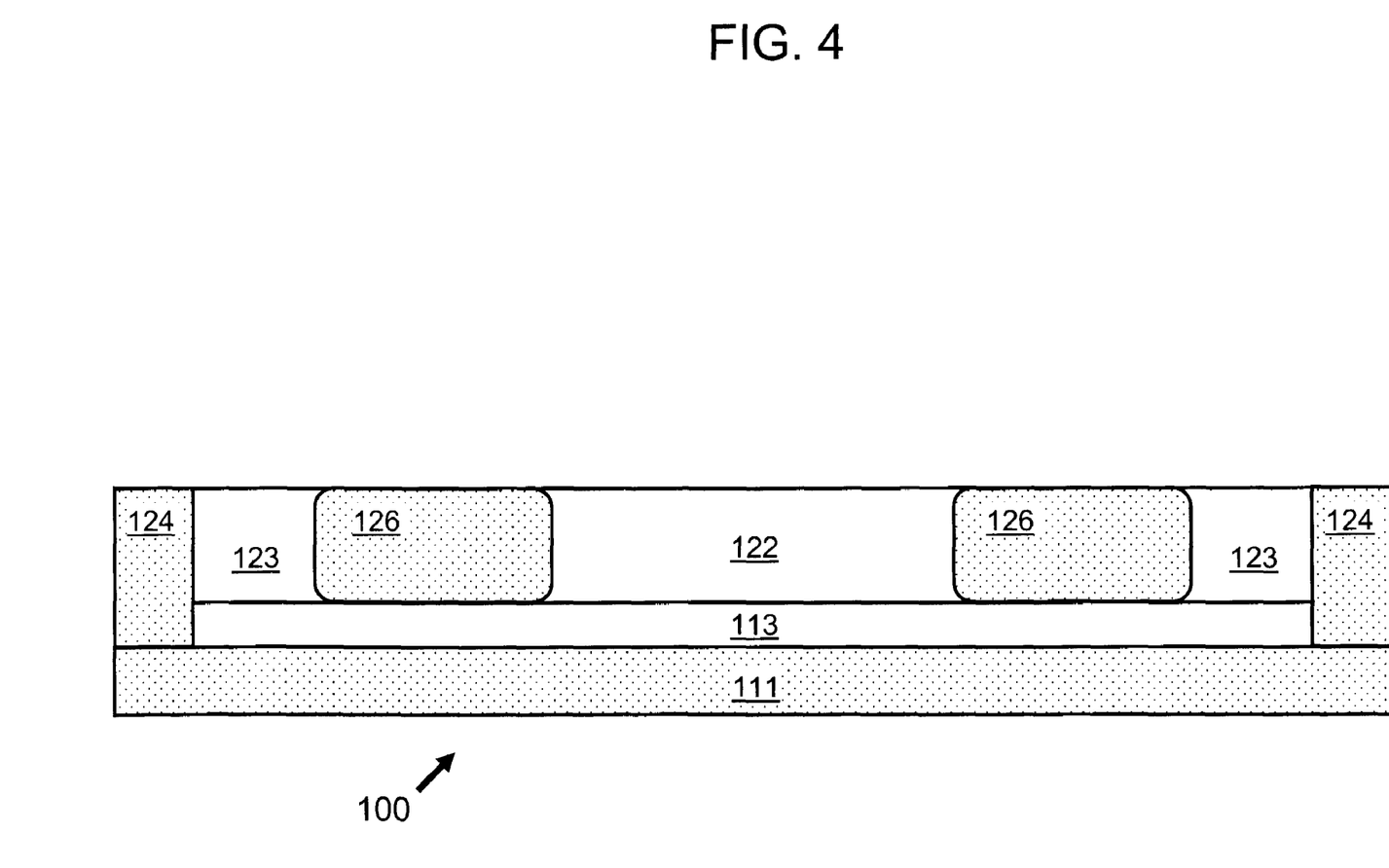

FIG. 4 illustrates that on top of sub-collector region 113, one embodiment of a method may include forming a collector 122, which may be part of an active region, and a reach-through region 123 (shown as two separate regions 123) of HBT 100. In forming active region 122 and reach-through regions 123, embodiment of a method may include first depositing a layer of dielectric material 126, for example oxide, on top of sub-collector region 113 and STI regions 114 (FIG. 3), and then creating openings inside dielectric material 126 for active region 122 and reach-through regions 123. Dielectric material 126 deposited on top of STI regions 114 may be referred to hereinafter, together with STI regions 114, as dielectric structures 124 as illustrated in FIG. 4. As a result, openings for active region 122 and reach-through regions 123 are separated by dielectric structures or material 126.

Next, an epitaxial layer of semiconductor material, for example silicon (Si) material, may be grown or formed in the openings to form active region 122 and reach-through regions 123. However other suitable semiconductor materials such as, for example, SiGe, may alternatively be use to form the active region. Epitaxial layer of active region 122 and reach-through regions 123 may be formed by applying any conventional semiconductor processes such as, for example, an atmospheric chemical vapor deposition (CVD) process. Top surfaces of active region 122, reach-through regions 123, dielectric structures 124 and 126 may then be planarized to become coplanar upon which further elements of the HBT 100 may be formed.

Figure 5:
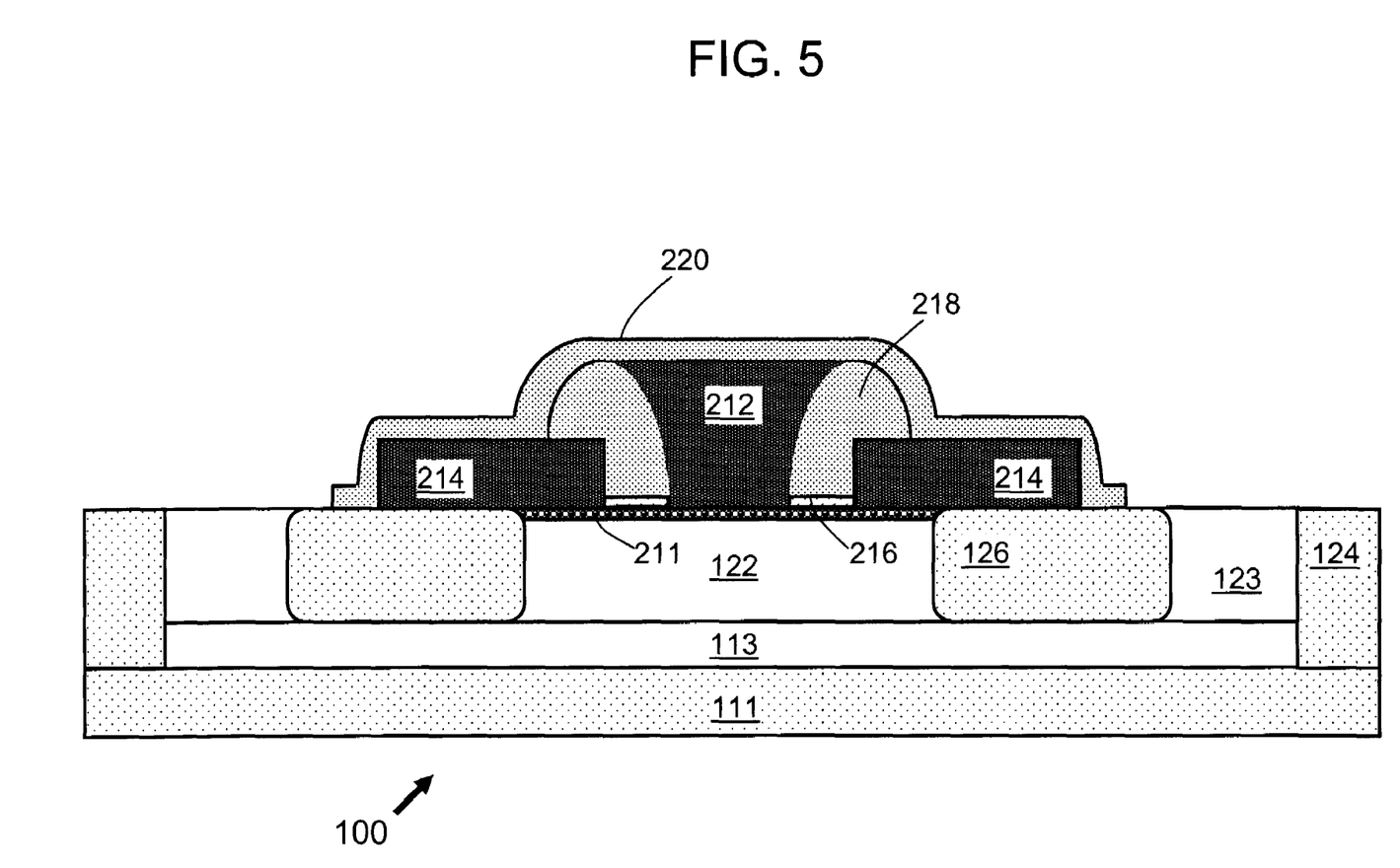

FIG. 5 illustrates that an intrinsic base 211 may be formed on a top surface of active region 122. Intrinsic base 211 may be a single crystal low-temperature epitaxial (LTE) layer of semiconductor material, such as silicon (Si), or semiconductor compound alloy such as SiGe. Alternatively, intrinsic base 211 may be a layer of SiGe formed by ion-implanting Ge into the top surface of active region 122. Intrinsic base 211 may be created such that it covers at least a most part of top surface of collector 122. Collector 122, including intrinsic base 211, may form part of the active region, and may therefore be referred to hereinafter as active region 122.

FIG. 5 also illustrates that on top of intrinsic base 211 and at least part of dielectric material structures 126, embodiment of a method of fabrication may include forming an emitter 212 and an extrinsic base 214 (shown as two extrinsic bases 214) by applying any of well-known HBT fabrication processes. A person skilled in the art shall note that underneath emitter 212 and inside intrinsic base 211 there may be formed a thin layer of emitting region (not shown) of emitter 212. Emitter 212 and extrinsic bases 214 may be made of conductive materials including for example polysilicon. Emitter 212 and extrinsic bases 214 may be separated and/or isolated by at least one spacer 218 (shown as two spacers 218) of dielectric material such as, for example, nitride. Other spacer materials such as oxide and/or oxynitride may be used as well. In addition, there may be a cap layer 216 of, for example, oxide between spacers 218 and intrinsic base 211 formed during processing. Emitter 212 and at least part of extrinsic bases 214 are formed on top of and in contact with intrinsic base 211. For example, emitter 212 may be disposed proximate a mid-point between extrinsic bases 214. The formation process of emitter 212, extrinsic bases 214, spacers 218, and cap layer 215 are well known in the art and thus not shown in detail in order not to obscure the essence of the present invention.

FIG. 5 also illustrates that a protective layer 220 may next be formed to cover polysilicon extrinsic bases 214, spacers 218 and emitter 212 after the formation thereof. Protective layer 220 may be a layer of oxide that may be applied to protect polysilicon of emitter 212 and extrinsic bases 214 and nitride spacers 218 from erosion during a subsequent recessing process of silicon (Si) in reach-through regions 123 due to etching. However, the invention is not limited in this respect and other protective materials may be used. In one embodiment, a protective layer may not be used at all.

Figure 6:
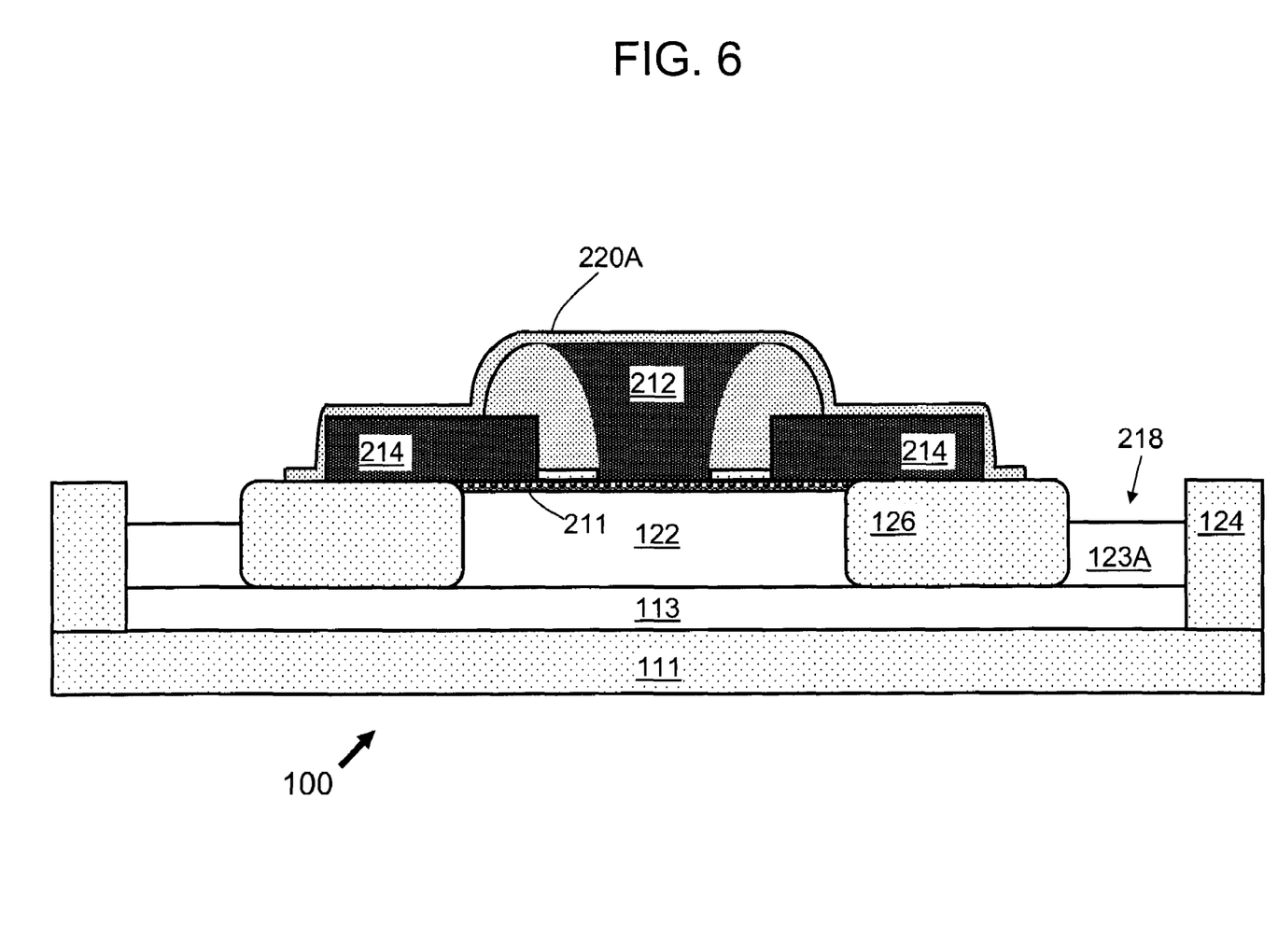

FIG. 6 illustrates that one embodiment of a method of fabrication may include creating recesses 218 at the top surface of reach-through regions 123. Recesses 218 may be created to provide spaces for silicided formed during a subsequent siliciding process in such a way that silicided formed in reach-through regions 123 may have a substantial same height (FIG. 9) as dielectric structures 124 and 126. Recesses 128 may be created or formed through well-known etching processes such as, for example, a selective RIE process with layer 220 protecting emitter 212, extrinsic bases 214, and spacers 218 from being etched. FIG. 6 illustrates that protective layer 220 may be trimmed during the process to have a slightly less thickness and become protective layer 220A, as is clear through comparison with FIG. 5.

Figure 7:
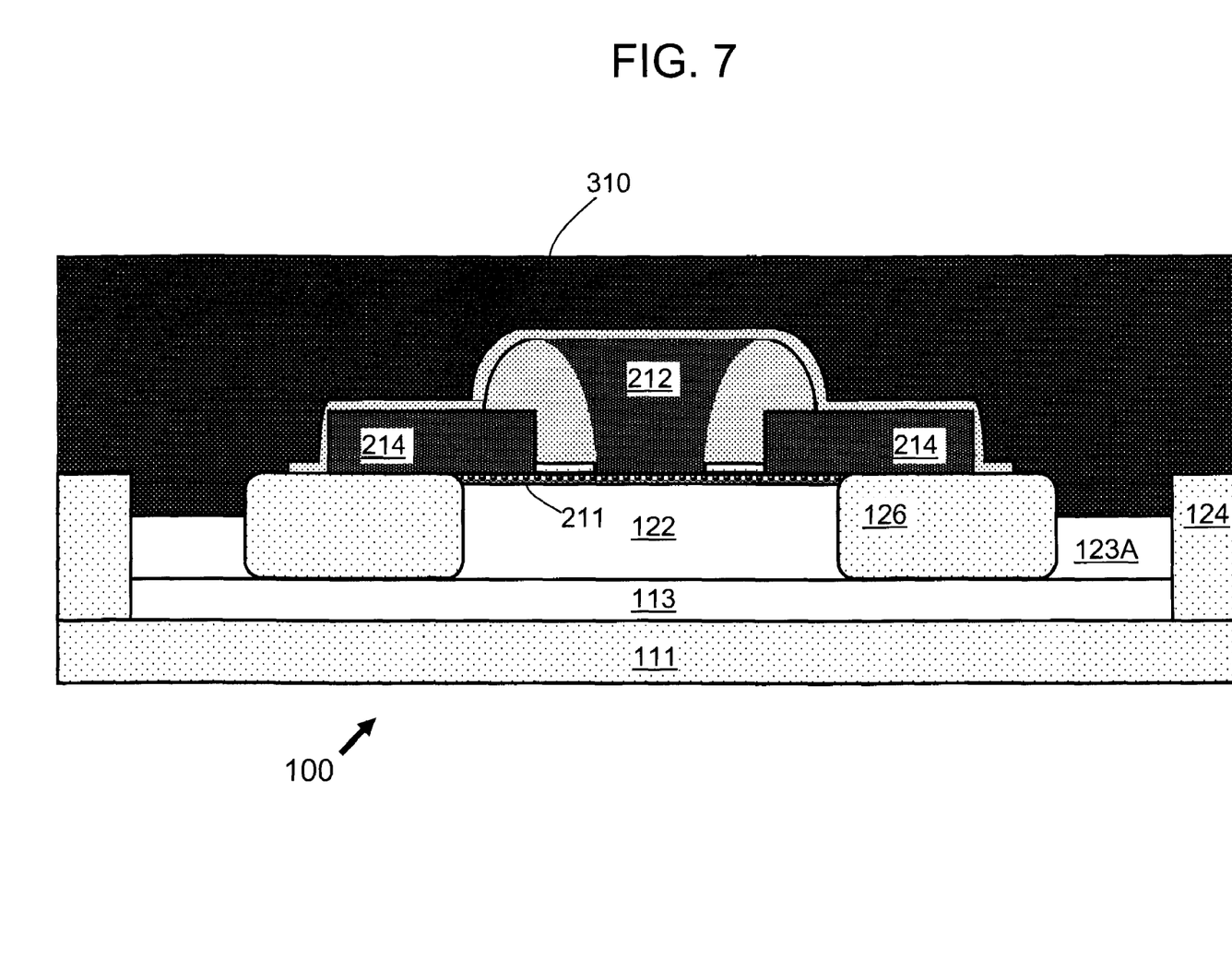

FIG. 7 illustrates that following the creation of recesses 128 in reach-through regions 123, one embodiment of a method of fabrication may include depositing a layer of nickel (Ni) 310 covering recessed areas 128 in reach-through regions 123. Nickel layer 310 may also cover top surface of protective layer 220A and dielectric structures 124 and 126. The deposition of nickel layer 310 may be performed through any well-known processes such as, for example, sputter depositing process. Nickel layer 310 may be used as a metal to form silicided reach-through and silicided sub-collector, as described below in detail with reference to FIGS. 8-9, for increased conductivity of a conductive pathway for electric charges collected by collector 122.

Figure 8:
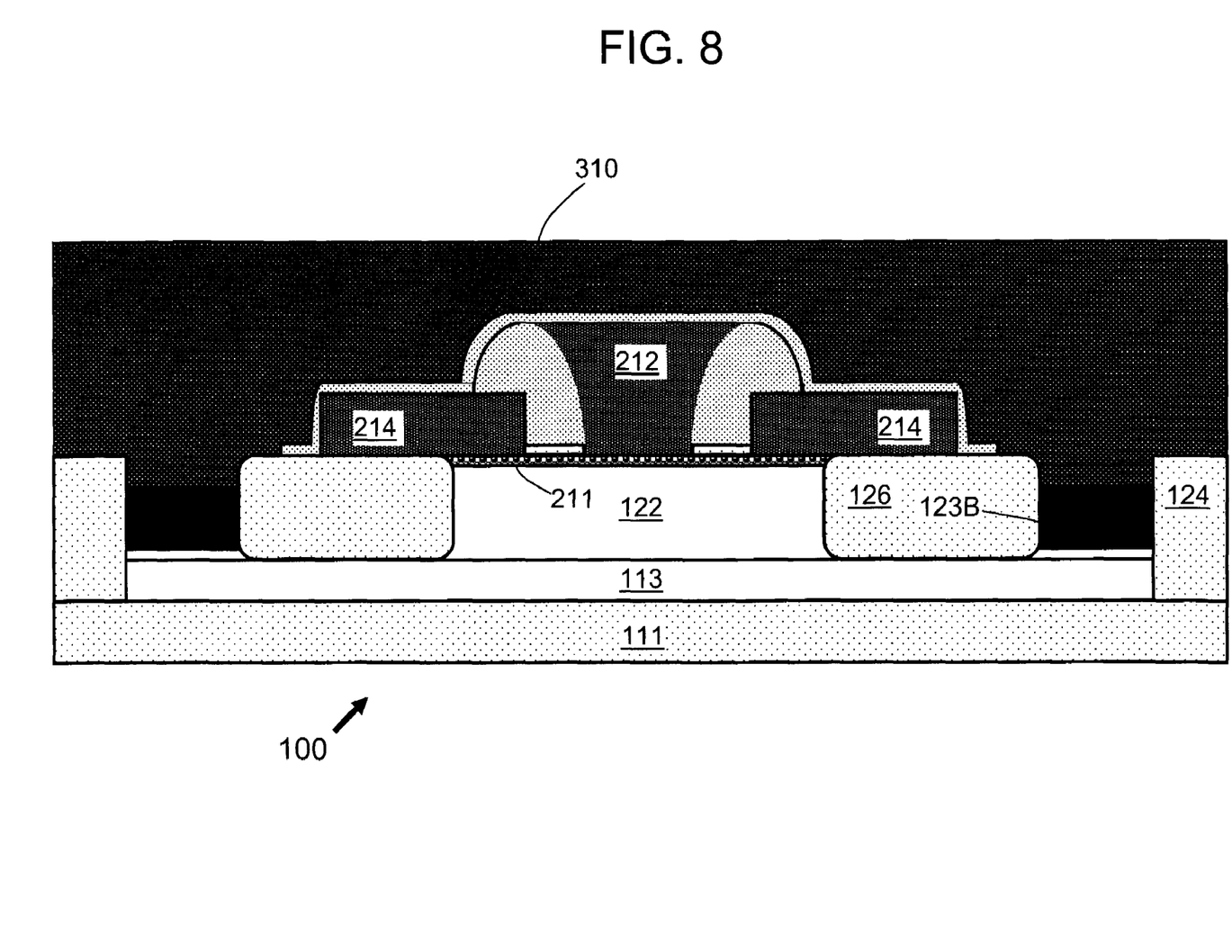
Figure 9:
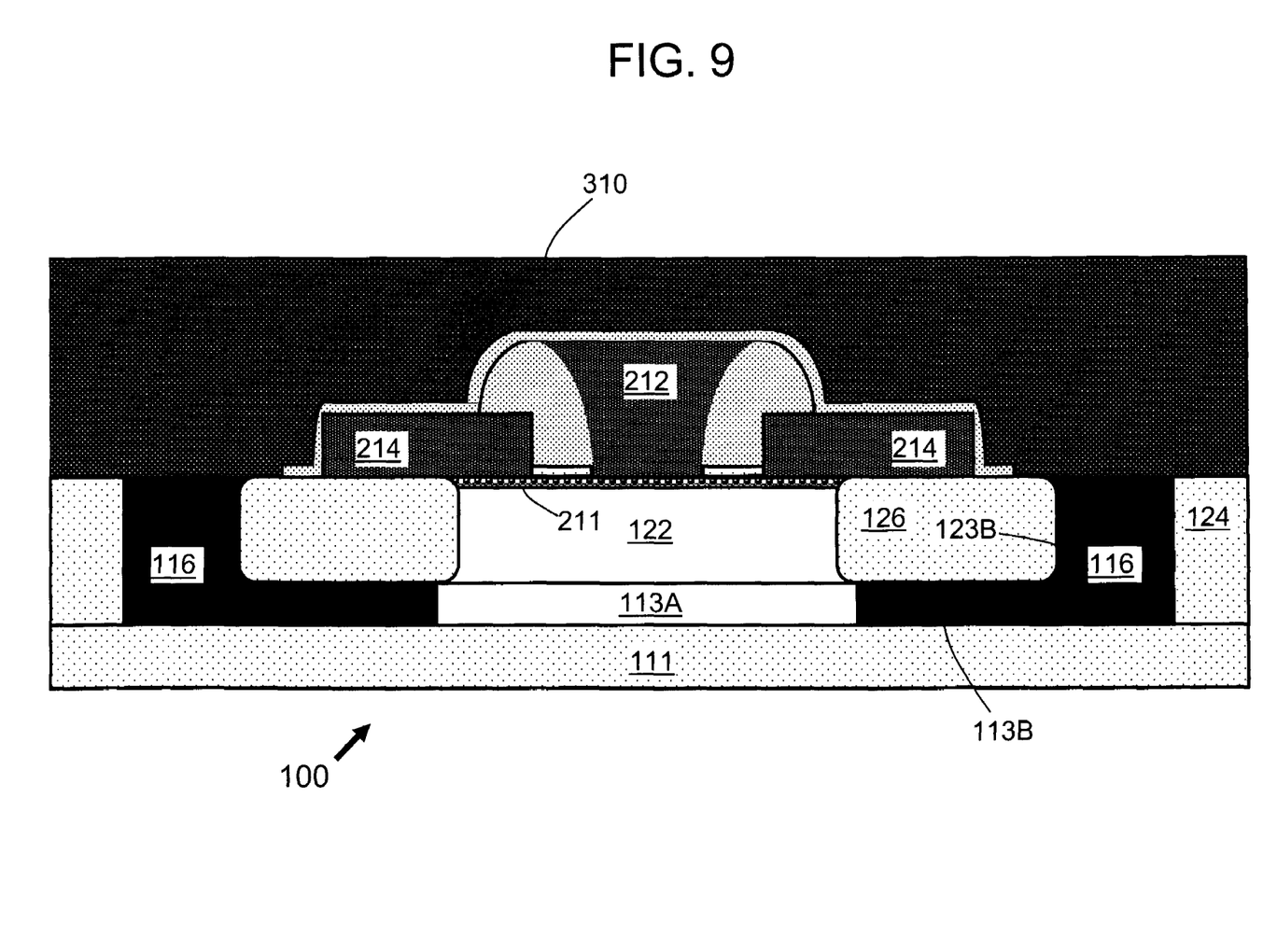

FIGS. 8-9 illustrate that after the deposition of nickel layer 310 in recessed areas 128 of reach-through regions 123, one embodiment of a method of fabrication may include subjecting HBT 100 to an annealing process. The annealing process may be conducted at a temperature suitable for causing nickel element of layer 310 to diffuse into Si of reach-through regions 123, and at least part of sub-collector region 113, to form nickel silicide (NiSi). For example, a temperature of about 450° C. to 600° C., preferably between 500° C. and 550° C., may be used in the annealing process. However the invention is not limited in this respect and other suitable temperatures may be used.

FIG. 8 illustrates that after performing an annealing process over a certain period of time, for example, from 2 to 20 minutes and preferably from 5 to 10 minutes, nickel silicide (NiSi) may be formed in at least part of reach-through regions 123. Embodiment of the method may include further conducting the annealing process to form nickel silicide up to sub-collector region 113, and continue forming nickel silicide along sub-collector region 113 towards active region 122 as shown in FIG. 9. The annealing process may be promptly terminated when formed nickel silicide reaches approximately the edge of active layer 122. According to one embodiment, the termination of annealing process may be timed so that nickel silicides formed from both left and right sides of reach-through regions 123 will not short underneath, and will not extend into, active region 122.

As is shown in FIG. 9, the annealing process may provide a silicided reach-through region 123B and a silicided section of sub-collector region 113 (silicided sub-collector 113B). Sub-collector region 113 may thus include a first sub-collector 113A of doped semiconductor and a second sub-collector 113B which is a silicided sub-collector. As described above and according to one embodiment, the depth of recesses 128 may be controlled and/or adjusted such that silicide may be formed up to substantially level with the top surface of dielectric structures 124 and 126. However, the invention is not limited in this respect and silicided reach-through 123B does not need to be at the same height as dielectric structures 124 and 126, and may be higher or lower than the top surface of dielectric structures 124 and 126.

Figure 10:
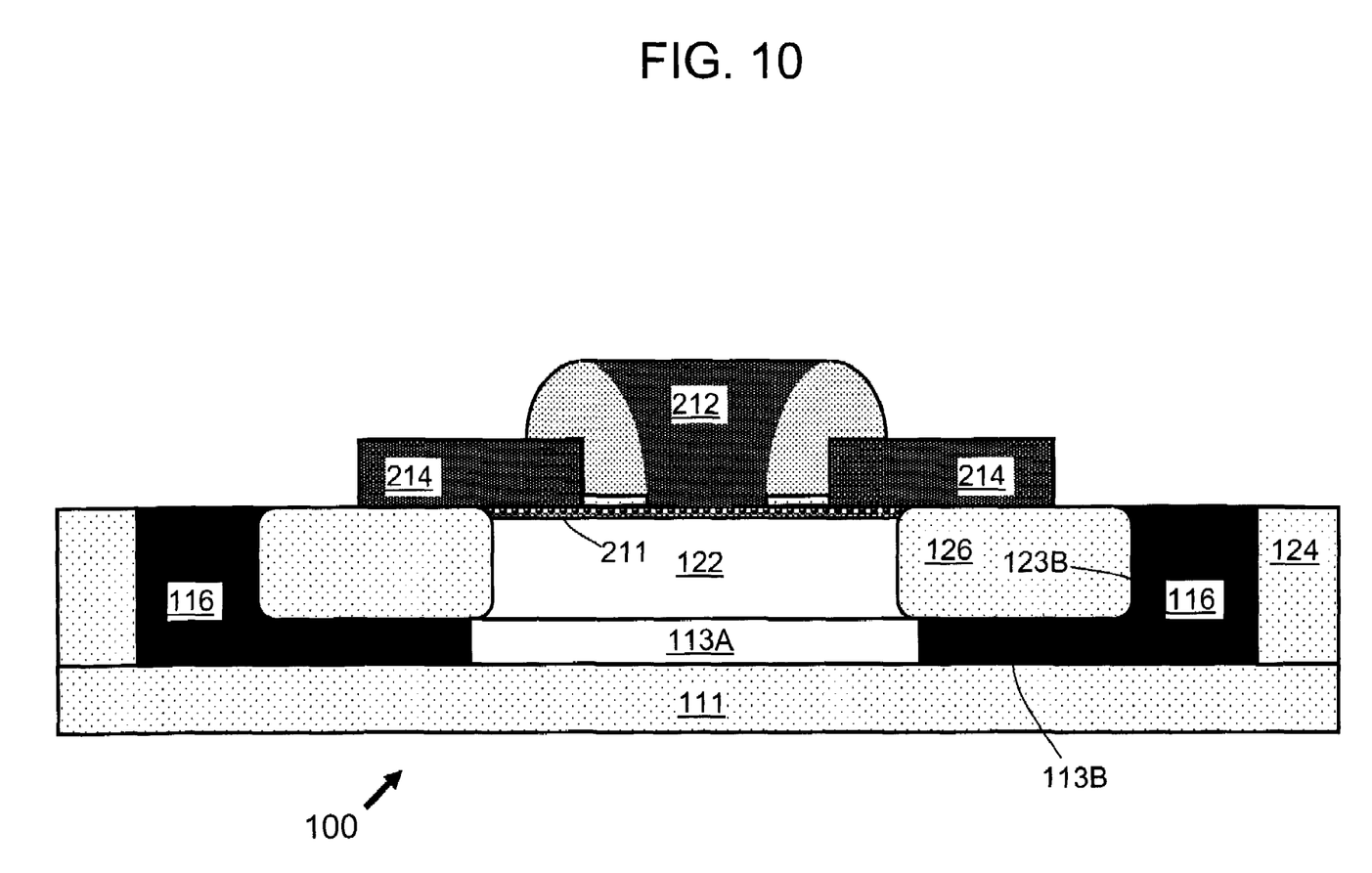
Figure 11:
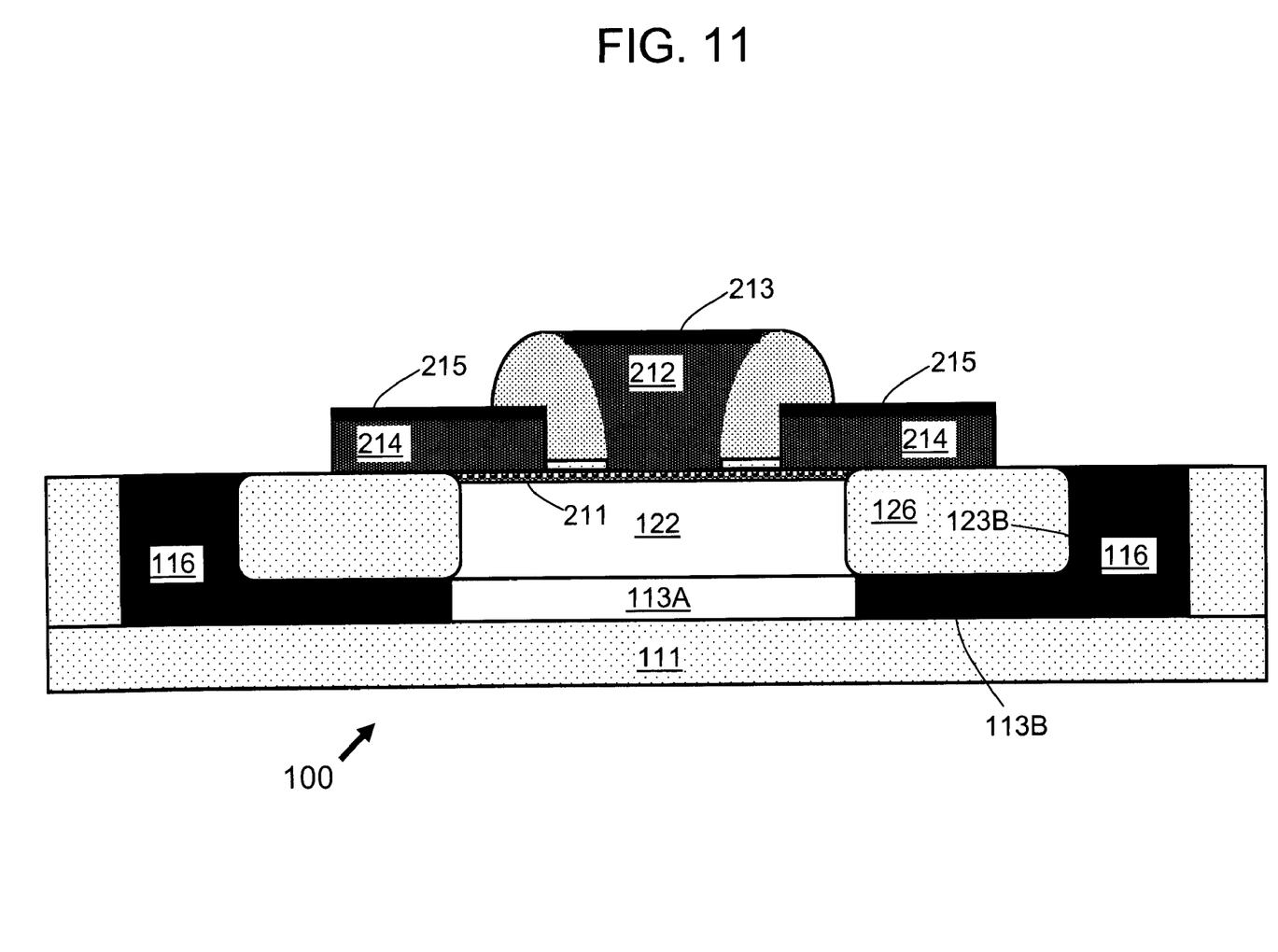

FIG. 10 illustrates that after the formation of silicided sub-collector 113B and silicided reach-through 123B, which together form a silicided conductive pathway 116, embodiment of a method of present invention may include selectively removing the unreacted nickel layer 310. Subsequently, protective layer 220A may be removed to expose emitter 212 and extrinsic bases 214 of polysilicon. As is shown in FIG. 11, top surfaces of emitter 212 and extrinsic base 214 may be subsequently subjected to a silicidation process to form a silicided section to function as a contact area with increased conductivity and reduced resistance. For example, a layer of nickel may be deposited on top of the polysilicon of emitter 212 and extrinsic bases 214. HBT 100 may then be subjected to an annealing process to cause polysilicion of emitter 212 and extrinsic bases 214 reacting with deposited nickel to form nickel silicide 213 and 215, respectively, on top surfaces of emitter 212 and extrinsic bases 214. The formation of NiSi sections 213 and 215 improves conductivity of contact to the base and emitter area of HBT 100.

A person skilled in the art may appreciate that NiSi sections or layers 213 and 215 may also be formed during the process of forming silicided conductive path 116. If NiSi layers 213 and 215 are to be formed together with silicided conductive path 116 which include silicided reach-through 123B and silicided sub-collector 113B (second sub-collector), protective layer 220A may be removed before depositing nickel layer 310. In this case, conditions for the silicidation may require careful adjustment such that NiSi layers or sections 213 and/or 215 may be controlled to a predetermined or desired thickness, including possible full silicidation (FUSI). On the other hand, the silicidation process shall be controlled such as not to create silicide of intrinsic layer 211 causing shortage between emitter 212 and extrinsic base 214, and/or collector 122.

According to one embodiment, a passivation layer (not shown) may be formed to cover the surface of silicide conductive path 116 while keeping polysilicon 212 and extrinsic base 214 available for silicidation. According to another embodiment, a metal material, such as cobalt (Co) which may form a silicide at a higher temperatures than nickel, may first be used to form silicide layer 213 and 215 while the surface of reach-through region 123 is protected by a passivation layer (not shown). The formed cobalt silicide layer 213 and 215 may prevent further silicidation of polysilicon of emitter 212 and extrinsic base 214 by acting as a barrier to the nickel diffusion during the subsequent formation of conductive path 116.

Figure 12:
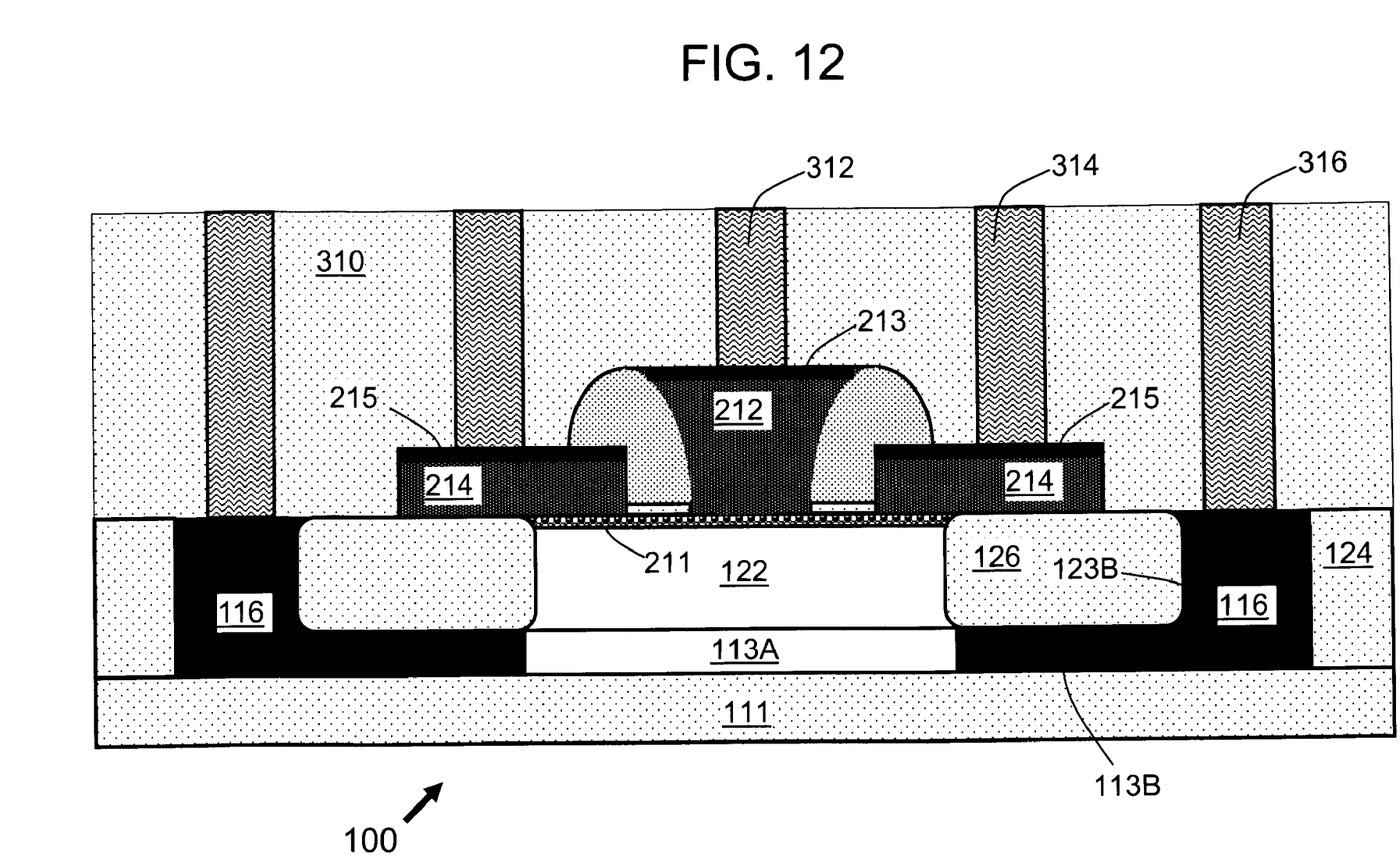

FIG. 12 illustrates that one embodiment of a method of fabrication may include forming conductive studs or electrical connections to emitter 212, extrinsic base 214, and collector 122 via conductive path 116. The formation may include first depositing a layer of dielectric material 310, and then creating openings inside dielectric layer 310 that extend to the silicided contact surfaces or areas 213 and 215 of emitter 212 and extrinsic bases 214, and silicided reach-through 123B of conductive pathway 116. Dielectric layer 310 may be a layer of oxide, nitride, oxynitride, or any other suitable materials. The openings may be created by any conventional etching processes such as, for example, an RIE process. The openings may then be filled with a conductive material such as, for example tungsten (W), to create conductive studs 312, 314, and 316, which may act as contact points to an outside circuitry for electrical connections to emitter 212, extrinsic bases 214, and collector 122 (through silicided conductive path 116 and first sub-collector 113A), respectively. In addition to tungsten (W), the material forming conductive studs 312, 314, and 316 may include, for example, aluminum, copper, or any other metal and/or other suitable materials.

While the invention has been described in terms of exemplary embodiments, those skilled in the art will recognize that the invention can be practiced with modifications and in the spirit and scope of the appended claims.

What is claimed is:

1. A semiconductor device, comprising:
   a collector in an active region;
   a first and a second sub-collector, said first sub-collector being a doped semiconductor adjacent to said collector and said second sub-collector being a silicided sub-collector next to said first sub-collector, said first and second sub-collectors being at a level below a bottom of said collector; and
   a silicided reach-through next to and in contact with said second sub-collector,
   wherein said first and second sub-collectors provide an horizontal conductive pathway and said silicided reach-through provides a vertical conductive pathway continued from said horizontal conductive pathway for electrical charges collected by said collector from said active region.

2. The semiconductor device of claim 1, wherein said silicided sub-collector and said silicided reach-through comprise a nickel silicide (NiSi) alloy.

3. The semiconductor device of claim 1, further comprising an emitter and an extrinsic base, wherein said emitter and at least a portion of said extrinsic base are formed on top of said active region.

4. The semiconductor device of claim 3, wherein said active region further comprises an intrinsic base upon which said emitter and said portion of said extrinsic base are formed.

5. The semiconductor device of claim 3, wherein said emitter and said extrinsic base are separated by at least one dielectric spacer.

6. The semiconductor device of claim 3, wherein at least one of said emitter and said extrinsic base comprises a polysilicon layer with a silicided section at a top surface of said polysilicon layer.

7. The semiconductor device of claim 3, further comprising a layer of oxide on top of said emitter, said extrinsic base, and said silicided reach-through, wherein one or more conductive studs are formed inside and through said layer of oxide, being in contact with said emitter, said extrinsic base, and said silicided reach-through, respectively.

8. The semiconductor device of claim 1, wherein said silicided reach-through is separated from said active region, which includes said collector and said intrinsic base, by a dielectric material, said dielectric material being at least partially on top of said second sub-collector.

9. The semiconductor device of claim 1, wherein a top surface of said first sub-collector is larger than an area of said active region contacting said top surface of said first sub-collector such that said second sub-collector is not in direct contact with said active region.

10. The semiconductor device of claim 1, wherein said first and second sub-collectors are formed in a layer of n-type heavily doped silicon material.

11. A heterojunction bipolar transistor (HBT), comprising:
    an active region including an intrinsic base and a collector;
    a sub-collector region at a level below a bottom of said active region, said sub-collector region being partially silicided to have a silicided portion; and
    a silicided reach-through in contact with said silicided portion of said sub-collector region,
    wherein said sub-collector region and said silicided reach-through provide a conductive pathway for electrical charges collected from said active region.

12. The HBT of claim 11, wherein said sub-collector region comprises a first and a second sub-collectors, said first sub-collector being a doped semiconductor and said second sub-collector being a silicided sub-collector.

13. The HBT of claim 12, wherein said second sub-collector is between said first sub-collector and said silicided reach-through and not in direct contact with said active region.

14. The HBT of claim 11, further comprising an emitter and an extrinsic base separated by at least one dielectric spacer, said extrinsic base being partially on top of said active region.

15. The HBT of claim 14, further comprising a plurality of conductive studs formed inside a layer of dielectric material, said plurality of conductive studs providing electrical connection to said emitter, said extrinsic base, and/or said collector, via said silicided reach-through, underneath said layer of dielectric material.

16. The HBT of claim 15, wherein said layer of dielectric material is selected from a group consisting of oxide, nitride, and oxynitride.

17. A semiconductor device, comprising:
    a collector;
    an emitter formed on top of said collector;

an extrinsic base formed at least partially on top of said collector;

a layer of dielectric material surrounding said collector, on which at least a portion of said extrinsic base is formed; and a silicided reach-through being connected to said collector, in an area away from said extrinsic base, through a sub-collector situated at a level equal or below a bottom of said-collector, wherein said sub-collector being partially silicided to have a silicided portion and said silicided portion of said sub-collector being in contact with said silicided reach-through.

18. The semiconductor device of claim 17, wherein said silicided reach-through comprises a nickel silicide (NiSi) alloy.

19. The semiconductor device of claim 17, wherein said sub-collector comprises a first sub-collector located underneath said collector and a second sub-collector located underneath said dielectric material, both of which providing a horizontal conductive pathway from said collector to said silicided reach-through.

20. The semiconductor device of claim 19, wherein said first sub-collector comprises a doped semiconductor and said second sub-collector comprises a silicided conductive material next to said first sub-collector and said silicided reach-through.

21. The semiconductor device of claim 20, wherein said silicided conductive material comprises a nickel silicide (NiSi) alloy.

22. The semiconductor device of claim 19, wherein said first and second sub-collectors are formed in a layer of n-type heavily doped silicon material.

23. The semiconductor device of claim 17, further comprising an intrinsic base between said emitter and said collector.

24. The semiconductor device of claim 17, wherein said emitter and said extrinsic base are separated by at least one dielectric spacer.

25. The semiconductor device of claim 17, wherein at least one of said emitter and said extrinsic base comprises a polysilicon layer with a silicided section at a top surface of said polysilicon layer.

* * * * *